United States Patent [19]

Nuqvist

[11] Patent Number: 5,212,834
[45] Date of Patent: May 18, 1993

[54] CIRCUIT FOR EXTENDING THE DYNAMIC RANGE OF AN INTERMEDIATE LEVEL SELECTOR

[75] Inventor: Jouni Nuqvist, Muurala, Finland

[73] Assignee: Nokia-Mobira Oy, Salo, Finland

[21] Appl. No.: 349,161

[22] Filed: May 9, 1989

[30] Foreign Application Priority Data

May 25, 1988 [FI] Finland .................................. 882471

[51] Int. Cl.[5] ........................... H04B 1/10; H04B 1/20
[52] U.S. Cl. ..................................... 455/311; 455/317
[58] Field of Search ............... 455/308, 309, 311, 317, 455/341

[56] References Cited

PUBLICATIONS

D. Anderson et al., "RF ICs for portable communications equipment", Electronic Components and Applications, vol. 7, No. 1, 1985, p. 37.
"Designing With The SA/NE604", Signetics Linear Products, Application Note, Jun. 1985, p. 2.
Audio Radio Handbook, The LM3089—Today's Most Popular FMIF System, 1980, pp. 3-8-3-14.
Handbook by ROHM, p. 53.

*Primary Examiner*—Reinhard J. Eisenzopf
*Assistant Examiner*—Lisa D. Charouel
*Attorney, Agent, or Firm*—Darby & Darby

[57] ABSTRACT

An FM intermediate-frequency circuit into which there is integrated at least a limiter-amplifier (1A) and a phase-locked loop which contains a VCO (4). The limiter-amplifier also includes a level detector. The dynamic range of the level detector is expanded without having to use excessive limiter-amplifier amplification, which would cause oscillation problems, by placing in parallel with the limiter-amplifier (1A) at least a second limiter-amplifier (1B), in connection with which there is also a level detector. The level of the input signal of the second limiter-amplifier (1B) is dropped as compared with that of the first limiter-amplifier (1A) by means of a dividing circuit (R1, R2). The signals (1A, 1B) obtained from the level detectors are combined to form one level detection signal (ITOT). If the signals are in the form of current, the combining can be carried out directly by summing the signals.

5 Claims, 2 Drawing Sheets

CIRCUIT FOR EXTENDING THE DYNAMIC RANGE OF AN INTERMEDIATE LEVEL SELECTOR

BACKGROUND OF THE INVENTION

The present invention relates to an FM intermediate-frequency circuit which at least includes a limiter-amplifier, a level detector, and a phase-locked loop containing a VCO oscillator. The level detector is incorporated into the limiter-amplifier to which the intermediate-frequency signal is applied.

One conventional FM intermediate-frequency circuit is shown in FIG. 1. In this figure an intermediate-frequency signal IF is fed to the limiter-amplifier (1) which contains a level detector 5 having an output signal I. The phase detector (2), the loop filter (3), and the VCO (4) form a phase-locked loop with an output FM demodulation (FM-dem) signal.

Assembling the elements of an intermediate-frequency circuit such as this, in which the FM detector is a PLL loop (which is made up of a phase detector, a loop filter and a VCO), results in problems for the total amplification of the limiter-amplifier. Excessive amplification will produce detrimental oscillation in the circuit, i.e. the limiter-amplifier will amplify only the VCO signal, the detection of the incoming signal being prevented. Therefore, the maximum usable amplification of the limiter-amplifier is approximately 50-60 dB.

When internal level detector of the limiter-amplifier is activated, its maximum dynamic range detection capacity is equal to the total amplification of all of the limiter-amplifiers within the circuit, i.e. according to the discussion above, 50-60 dB. This dynamic range is, however, too low for radio telephone applications, for example, since these applications typically require a dynamic range of approximately 75 dB.

There are on the market very few intermediate-frequency circuits in which the FM demodulation of the signal has been implemented by means of a PLL, and usually these circuits do not have level detection of the input signal. If the total amplification of the limiter-amplifier is, for example, over 90 dB, the PLL detector can be implemented in such a way that the VCO is in another circuit at a sufficient distance from the input of the limiter-amplifier. The condition is thus that the isolation requirement for avoiding oscillation is fulfilled.

There is no precise numerical value for the amplification of the limiter-amplifier. What is most important is that the total amplification of the system sufficient to bring the output of the limiter-amplifier circuit up to the limit. If the amplification of the limiter-amplifier is "deficient", i.e. it is not limited to its own noise, the missing amplification must be made up by amplification of the pre-stages, and vice versa.

SUMMARY OF THE INVENTION

The object of the present invention is to extend the dynamic range of the level detector without using a limiter-amplifier whose amplification would cause detrimental oscillation. In order to achieve this object, the intermediate-frequency circuit according to the invention is characterized in that it has, in parallel with a first limiter-amplifier, at least one second limiter-amplifier, both having an internal level detector. The level of the input signal of the second limiter-amplifiers amplifiers is reduced, by means of a level-dividing circuit, as compared with the first limiter-amplifier. The output the signals of the level detectors of all the limiter-amplifiers within the circuit are combined into one level detection signal.

The level-dividing circuit at the input of the second limiter-amplifier, is preferably calibrated so that the operating range of the second limiter-amplifier begins at that level of the intermediate-frequency signal at which the operating range of the first limiter-amplifier ends. The level-dividing circuit can be implemented, for example, by using resistors.

It has been observed that, in the intermediate-frequency circuit according to the invention, the total amplification of the limiter-amplifier can be limited to 50-60 dB, whereby the oscillation tendency of the VCO and the limiter-amplifier is eliminated. By means of two level detectors in parallel it is, however, possible to accomplish the required dynamic range of over 75 dB. In principle the dynamic range has no upper limit, since there can always be in parallel the necessary number of amplifiers and level-dividing circuits.

In principle it is thus possible to increase the dynamic range of the level detector of an intermediate-frequency circuit by using an extra outside level-detection circuit that is suppressed by resistor division, and to sum the level signals thus obtained.

Resistor division may well be replaced with, for example capacitive division, and the level signals received from the limiter-amplifier may be in the form of voltage or current, although a current-form output is more practical for the reason that currents can be directly summed.

In practice the coupling of two limiter-amplifiers in parallel will suffice, and the level-dividing circuit is determined as a case-by-case basis according to what is best suited from the viewpoint of the bias voltages of the amplifier.

It is seen as a limitation of the intermediate-frequency circuit according to the invention that the maximum amplitude of the incoming intermediate-frequency signal must be greater than it would be without the coupling in parallel by the amount of the additional dynamic range of the level detector. Since the incoming intermediate-frequency signal is usually received from a mixer, and in practice this signal has a certain maximum level, this provides an upper limit for the total dynamic range of the level detector. However, as stated above, a total dynamic range of over 75 dB can easily be obtained by means of such a coupling, even at low operating voltages (under 6 V).

BRIEF DESCRIPTION OF THE DRAWINGS

The invention is described below in greater detail in the form of an example and with reference to the accompanying drawing, in which.

DETAILED DESCRIPTION

Figure 1:
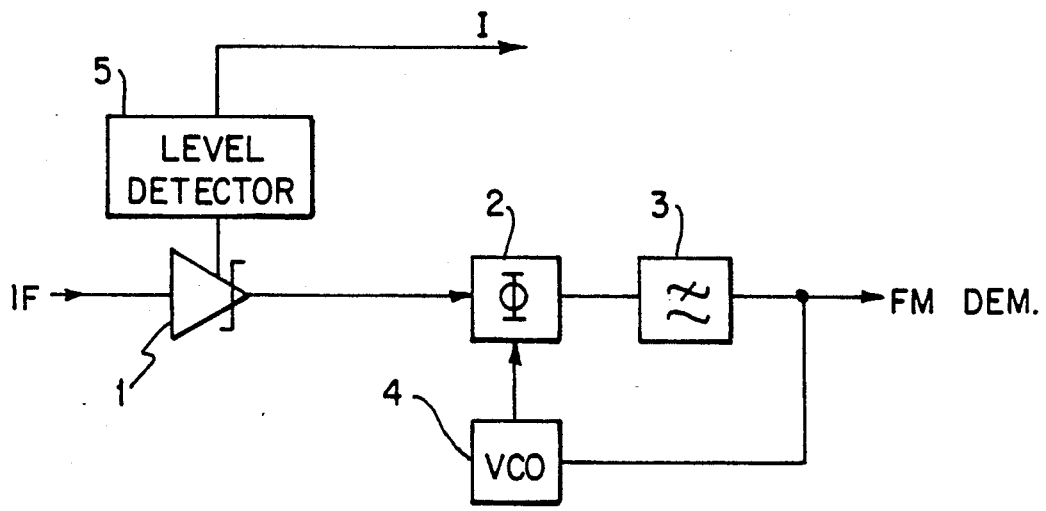
FIG. 1 is a block diagram of a conventional FM intermediate-frequency circuit.
Figure 2:
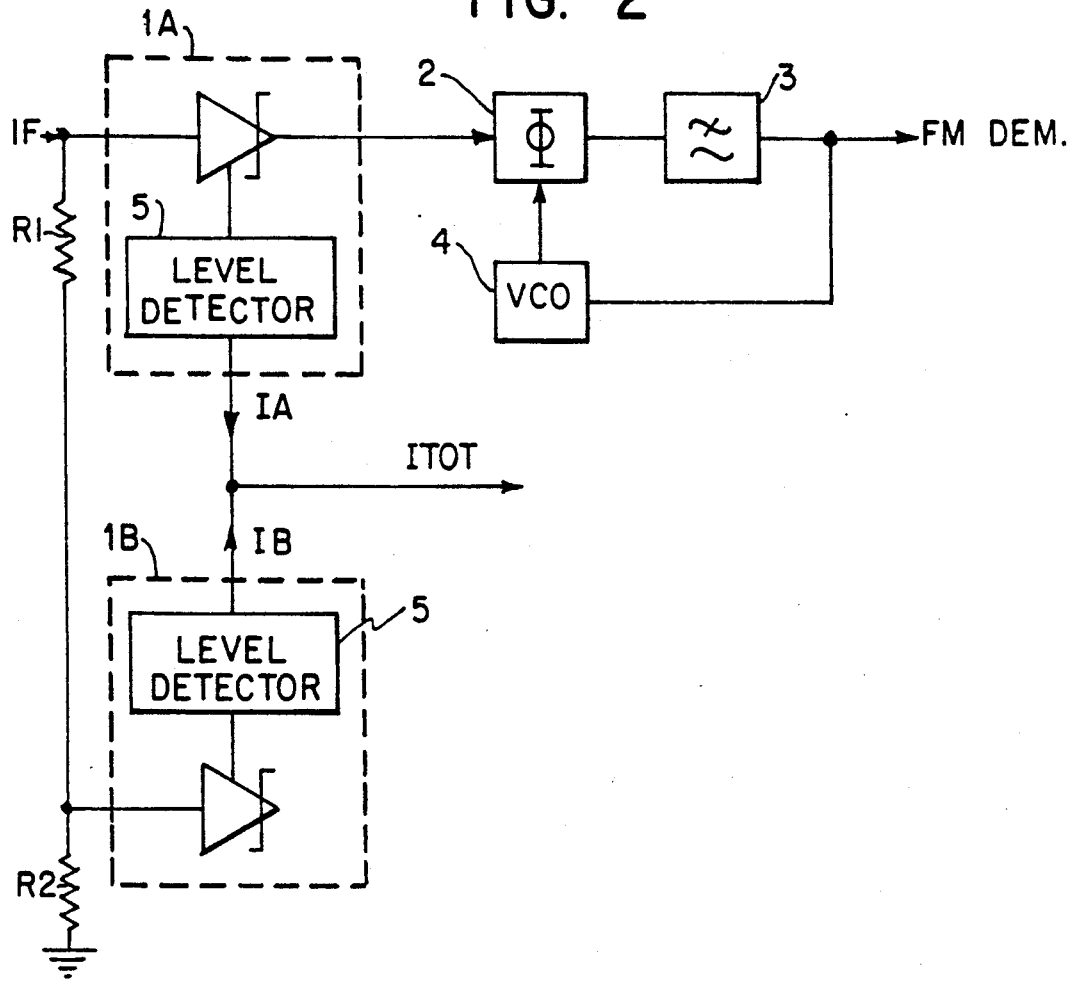
FIG. 2 is an illustrative embodiment of the FM intermediate-frequency circuit according to the invention.

In FIG. 2, reference numerals 2-4 indicate a phase detector, a loop filter, and a VCO, as in FIG. 1. In FIG. 2, the limiter-amplifier 1 with level detector belonging to it is replaced by two parallel limiter-amplifiers 1A and 1B. This modification of the conventional FM intermediate frequency circuit allows the dynamic range of the circuit to be increased above 50-60 dB without causing detrimental oscillation to arise in the circuit.

Each limiter-amplifier in FIG. 2 has its own level detectors from which current-form signals IA, IB are obtained, by applying an input current to the limiter-amplifiers 1A and 1B. The level of the input current of the second limiter-amplifier (1B) is reduced by a level-dividing circuit. In this figure, the level-dividing circuit consists of resistors R1 and R2. Signals 1A and 1B are summed directly to form the level detection signal ITOT.

Figure 3:
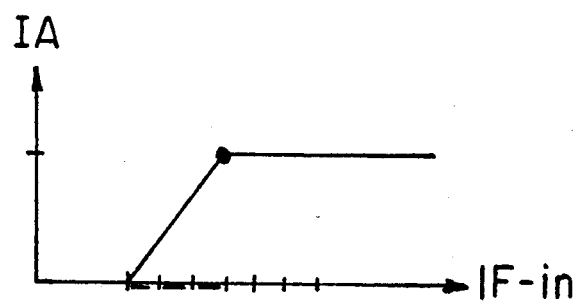
FIGS. 3-5 are illustrations of current curves related to the operation of the circuit of FIG. 2.

FIG. 3 depicts the current signal IA of the level detector of the limiter-amplifier 1A, as a function of the input signal of the amplifier, i.e. the intermediate-frequency signal IF. The output signal IA increases linearly according to the input signal IF until the upper limit of the amplifier IA is reached.

Figure 4:
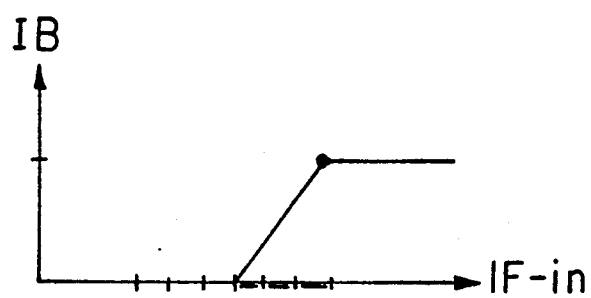

By means of the resistor divider R1, R2 the input signal of the parallel limiter-amplifier 1B is dropped so low that the lower limit of the operating range of the amplifier 1B is not reached until the level of the signal IF is the upper limit of the amplifier 1A. The level detection signal IB is depicted as a function of the signal IF in FIG. 4.

Figure 5:
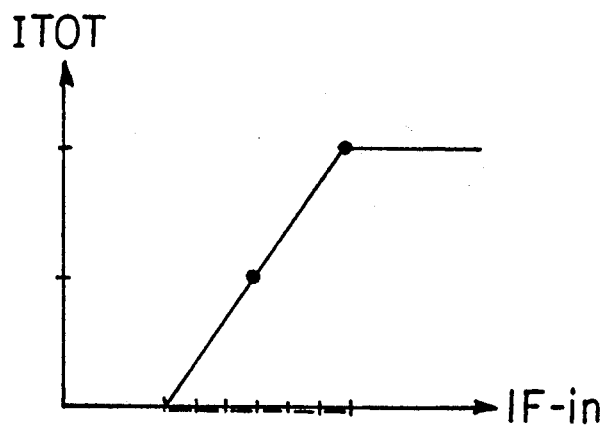

As shown in FIG. 5, when the signals IA and IB are summed, a level detection signal ITOT is obtained which increases linearly with the input signal IF within the range corresponding to the combined operating ranges of the amplifiers 1A and 1B.

As stated above, the level-dividing circuit can also be implemented by methods other than resistor division, and there may be more than two limiter-amplifiers in parallel.

I claim:

1. An FM intermediate-frequency circuit comprising a first limiter-amplifier (1A) having an internal level detector and a phase-locked loop having a VCO(4), characterized in that at least a second limiter-amplifier (1B) having an internal level detector is placed in parallel with the first limiter-amplifier, the first limiter-amplifier produces a first output signal (IA) in response to receipt of a first intermediate frequency signal;

the second limiter-amplifier produces a second output signal (IB) in response to receipt of a second intermediate frequency signal;

the second intermediate frequency signal level being reduced to a level below the first intermediate frequency level by a level-dividing circuit; and the first and second output signals being combined to form a level detection signal (ITOT).

2. An intermediate-frequency circuit according to claim 1, wherein the level-dividing circuit comprises resistors (R1, R2).

3. An intermediate-frequency circuit according to claim 1, wherein the level-dividing circuit is calibrated so that the operating range of the second limiter-amplifier (1B) begins at that intermediate-frequency signal level at which the operating range of the first limiter-amplifier (1A) ends.

4. An intermediate-frequency circuit according to claim 3, wherein the level-dividing circuit comprises resistors (R1, R2).

5. An intermediate-frequency circuit according to claim 1, wherein the first and second limiter-amplifiers and the phase-locked loop form an integrated circuit.

* * * * *